(12) United States Patent
Kagaya et al.

(10) Patent No.: US 7,894,726 B2
(45) Date of Patent: Feb. 22, 2011

(54) OPTICAL RECEIVER MODULE

(75) Inventors: Osamu Kagaya, Tokyo (JP); Yukitoshi Okamura, Fujisawa (JP); Atsushi Miura, Yokohama (JP); Michihide Sasada, Yokohama (JP); Hideyuki Kuwano, Fujisawa (JP)

(73) Assignee: Opnext Japan, Inc., Yokohama (JP)

( * ) Notice: Subject to any disclaimer, the term of this patent is extended or adjusted under 35 U.S.C. 154(b) by 866 days.

(21) Appl. No.: 11/451,366

(22) Filed: Jun. 13, 2006

(65) Prior Publication Data

US 2007/0177883 A1 Aug. 2, 2007

(30) Foreign Application Priority Data

Jan. 27, 2006 (JP) ............... 2006-018448

(51) Int. Cl.
*H04B 10/06* (2006.01)
(52) U.S. Cl. .............. 398/202; 398/207; 398/212; 398/201; 398/164
(58) Field of Classification Search .......... 398/202, 398/164, 207, 212, 201; 250/214 A; 385/89
See application file for complete search history.

(56) References Cited

U.S. PATENT DOCUMENTS

| | | | | |
|---|---|---|---|---|
| 4,791,647 A | * | 12/1988 | Sugou | ............... 372/45.01 |
| 6,034,424 A | * | 3/2000 | Fujimura et al. | ............ 257/696 |
| 6,547,451 B1 | * | 4/2003 | Nishikawa et al. | ............ 385/88 |
| 6,806,547 B2 | * | 10/2004 | Kohmoto et al. | ............ 257/433 |
| 2003/0081297 A1 | * | 5/2003 | Hasegawa et al. | ........... 359/189 |
| 2004/0081473 A1 | * | 4/2004 | Sherazi et al. | ............. 398/212 |
| 2005/0169640 A1 | * | 8/2005 | Grubb et al. | ................ 398/183 |
| 2006/0067713 A1 | * | 3/2006 | Farooqui et al. | ............ 398/209 |
| 2007/0152136 A1 | * | 7/2007 | Yao et al. | ................ 250/214 A |

FOREIGN PATENT DOCUMENTS

| | | |
|---|---|---|
| EP | 0355610 | 2/1990 |
| EP | 0684651 | 11/1995 |
| EP | 0825653 | 2/1998 |
| EP | 0909044 | 4/1999 |
| JP | 2004-254125 | 9/2004 |

* cited by examiner

*Primary Examiner*—Ken N Vanderpuye
*Assistant Examiner*—Hibret A Woldekidan
(74) *Attorney, Agent, or Firm*—Mattingly & Malur, P.C.

(57) ABSTRACT

A semiconductor chip on which a light receiving element is mounted, a preamplifier for amplifying an output signal from the light receiving element, and an insulating carrier substrate on which the light receiving element is mounted are connected such that the output signal from the light receiving element is input to the preamplifier through electrodes on the carrier substrate, and there are provided two electrodes, on the carrier substrate, having a capacitance value of 40 fF or more therebetween in a state where no light receiving element is mounted.

11 Claims, 5 Drawing Sheets

OPTICAL RECEIVER MODULE

CLAIM OF PRIORITY

The present application claims priority from Japanese patent application serial no. 2006-018448, filed on Jan. 27, 2006, the content of which is hereby incorporated by reference into this application.

BACKGROUND OF THE INVENTION

The present invention relates to an optical receiver module, and particularly to an optical receiver module with a high transmission rate of approximately 10 Gbits/s.

An optical receiver module in which a semiconductor photodiode is used as a receiver element is one of the key devices of transceivers for optical fiber transmission. With the recent spread of broadband networks, the optical receiver modules have increased in speed and the optical receiver modules with a bit rate of up to 10 Gbits/s are beginning to be widely used. The optical receiver modules suitable for the above-mentioned application are strongly demanded to be downsized, to be manufactured at low cost, and to be of low power consumption as well as to realize a good frequency bandwidth characteristic.

JP-A No. 2004-254125 discloses an optical receiver module in which a semiconductor photodiode and a preamplifier are mounted in a TO package to realize downsizing and low cost, and the impedance with respect to a high-speed signal at 10 GHz is decreased by reducing the inductance applied to a ground pad of the preamplifier, thereby securing a good frequency characteristic.

There are two cases as user demands depending on a design system of a transceiver in, particularly, the application to long distance transmission: one case is that linearity is required for receiver modules; and another case is that high receiver sensitivity is required for receiver modules.

In the case of making the power consumption of the module lower in the prior art, there arises a need to produce plural kinds of semiconductor photodiodes whose designs are changed in accordance with the kind of preamplifier to be mounted. As a result, there has been a problem that the usability of a semiconductor wafer is deteriorated, which makes it difficult to manufacture the semiconductor photodiodes at low cost.

Two power sources with positive and negative of −5.2V and +3.3V are conventionally available as power sources of a preamplifier in application to 300-pin MSA transceivers, and there is a sufficient margin in operating voltage. Therefore, it is possible to satisfy the both requirements with the use of one kind of preamplifier. To the contrary, for requirement of low power consumption in application to XFP transceivers that are becoming a mainstream, the driving voltage of the receiver modules is lowered to +3.3V of a single power source.

In the case of the single power source of +3.3V, it is difficult to design a preamplifier which satisfies the linearity and the high receiver sensitivity at the same time. For that reason, there arises a need to use different kinds of preamplifier ICs, i.e., a preamplifier IC with linearity and a preamplifier IC with high receiver sensitivity, whose designs are different from each other in receiver modules.

According to the study by inventors, the input impedance of a preamplifier with two power sources is about 30Ω (ohm). On the contrary, along with the requirement of the single power source of +3.3V, the preamplifiers are differentiated also in terms of input impedance. That is, the preamplifier with high linearity has a high input impedance of about 70Ω along with low gain. On the other hand, the preamplifier with high receiver sensitivity has a low input impedance of 20Ω to 30Ω along with first stage low noise.

In the case where the input impedance of the preamplifier is approximated by an input resistance Rin, a high-frequency equivalent circuit from a photodiode to an input portion of a preamplifier is as shown in FIG. 1. In FIG. 1, Cpd, Rpd, and L represent, a capacitance of the photodiode, a series resistance of the photodiode, and an inductance configured by a bonding wire, respectively. In order to obtain a desired good high frequency characteristic in the optical receiver module, the values of Rpd, Cpd, and L are selected to optimize the frequency dependency (i.e., angular frequency ω (omega) dependency) in which a photocurrent Iph (ω) generated at the photodiode generates a voltage Vin (ω) at both ends of the input resistance Rin.

[Formula 1]

$$Vin(\omega) = Iph(\omega) * Rin / (1 + j\omega Cpd * (Rin + Rpd + j\omega L)) \quad (1)$$

On the basis of Formula 1, there will be examined a case in which the frequency characteristic of the optical receiver module is optimized by using, for example, the preamplifier with high receiver sensitivity having an input impedance of 30Ω and the preamplifier is changed for the preamplifier with high linearity having an input impedance of 70Ω. In this case, it is understood that Rpd and L are multiplied by 2.3 (70/30) in proportion to Rin, and Cpd is multiplied by 0.43 (30/70) in inverse proportion to Rin. L is easily changed with a bonding wire length. On the other hand, since a light receiving area and the capacitance Cpd are substantially in a proportional relation and the light receiving area and the series resistance Rpd are substantially in an inversely-proportional relation in the photodiode, it is necessary to reduce the light receiving diameter by 0.65 times ($\sqrt{(30/70)}$) in order to satisfy both Rpd and Cpd.

As described above, in order that two kinds of preamplifiers that are different in the input impedance are separately used in the optical receiver module to obtain the same good frequency characteristic in each case, it is necessary to prepare two kinds of light receiving elements that are different in the light receiving diameter in a structure of a conventional optical receiver module. However, the light receiving element that is an important part, especially, an avalanche photodiode for long distance use is expensive. From the viewpoint of manufacturing photodiodes, there is a strong demand that the kind of photodiode is standardized irrespective of the kind of preamplifier so as to enhance the usability of a semiconductor wafer, to reduce chip unit cost, and to cut back production-inventory.

However, the invention disclosed in JP-A No. 2004-254125 fails to satisfy the demand, and there arises a problem that it becomes difficult to lower the cost of the semiconductor photodiode and furthermore the optical receiver module.

SUMMARY OF THE INVENTION

The object of the present invention is to provide an optical receiver module that can realize a good frequency transmission characteristic (S21) even in the case where preamplifiers having different input impedances are used while using a light receiving element with the same design.

The object can be achieved by connecting a light receiving element for receiving an optical signal to convert the same into an electrical signal, a preamplifier for amplifying an output signal from the light receiving element, and an insulating carrier substrate on which the light receiving element is mounted, such that the output signal from the light receiving element is input to the preamplifier through electrodes on the carrier substrate, and by providing two electrodes, on the carrier substrate, having a capacitance value of 40 fF (femto-farad) or more therebetween in a state where no light receiving element is mounted.

Further, the object can be achieved by connecting a light receiving element for receiving an optical signal to convert the same into an electrical signal, a preamplifier for amplifying an output signal from the light receiving element, and an insulating carrier substrate on which the light receiving element is mounted, such that the output signal from the light receiving element is input to the preamplifier through electrodes on the carrier substrate, and by making the capacitance value between two electrodes on the carrier substrate in a state where no light receiving element is mounted 40% or more of the capacitance value between an anode electrode and a cathode electrode of the light receiving element.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
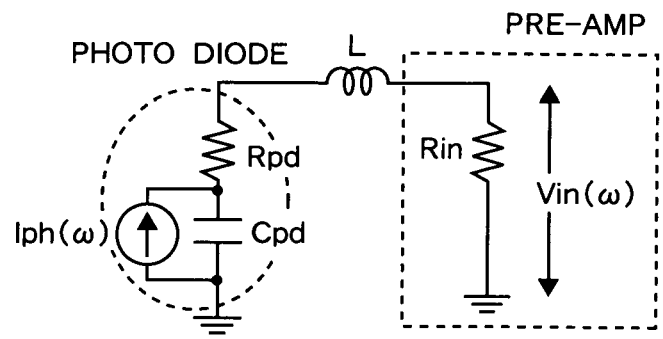
FIG. 1 is a diagram of a high-frequency equivalent circuit from a photodiode to an input portion of a preamplifier.

Hereinafter, the embodiment of the present invention will be described using examples with reference to the drawings. It should be noted that identical portions are given the same reference numeral, and the explanation thereof is not repeated.

Example 1

Figure 2:
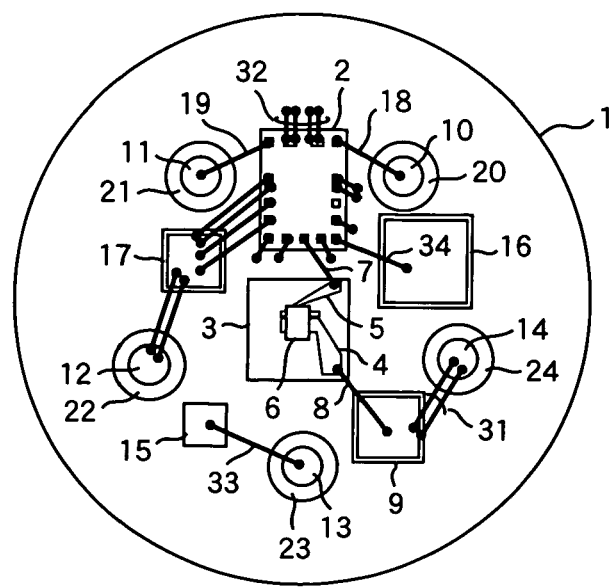
FIG. 2 is a plan view depicting main parts of an optical receiver module.
Figure 3A:
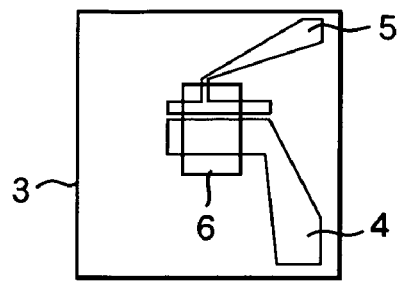
FIGS. 3A and 3B are partially perspective plan views of a carrier substrate part.
Figure 3B:
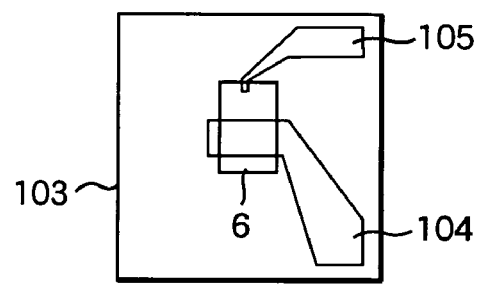
Figure 4:
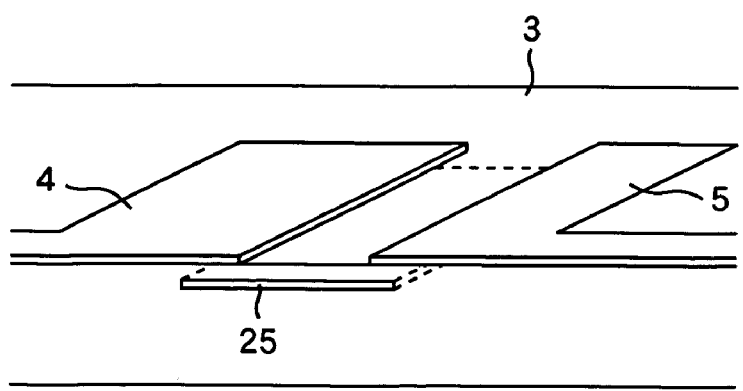
FIG. 4 is a perspective sectional view of the carrier substrate.
Figure 5:
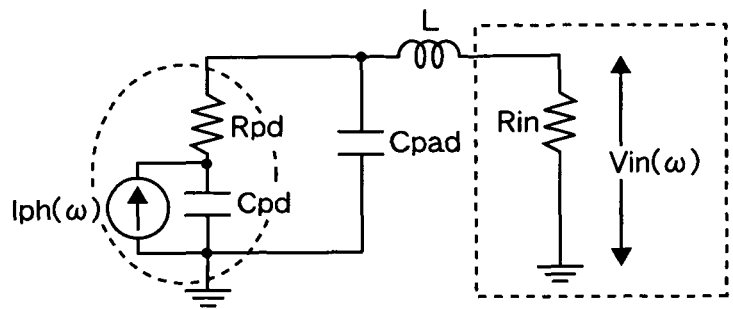
FIG. 5 is a diagram of a high-frequency equivalent circuit from a photodiode to an input portion of a preamplifier.
Figure 6:
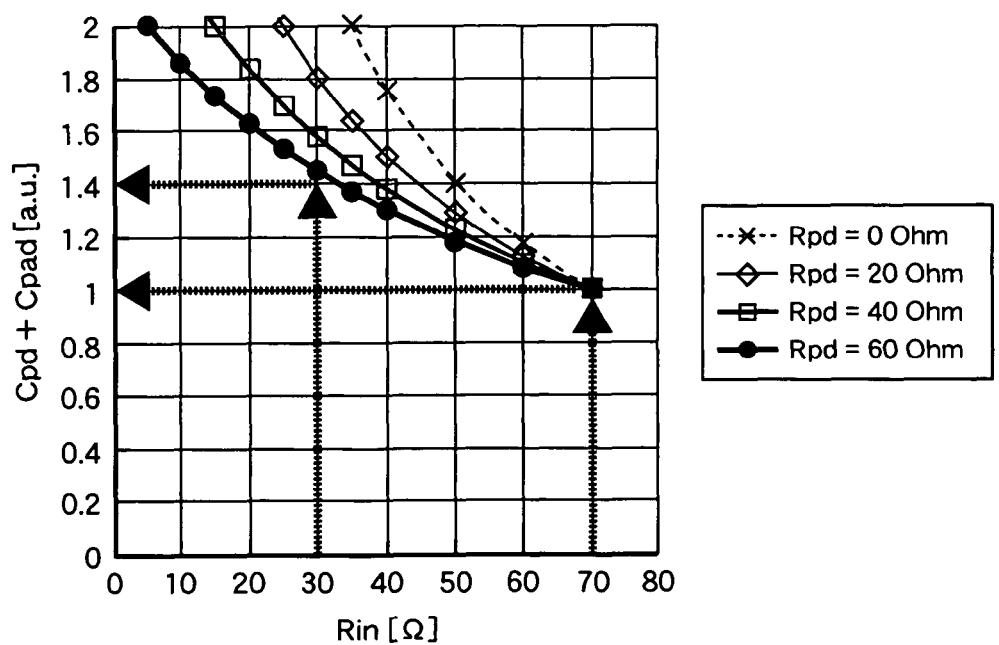
FIG. 6 is a graph showing a relation between input impedance and capacitance value.
Figure 7A:
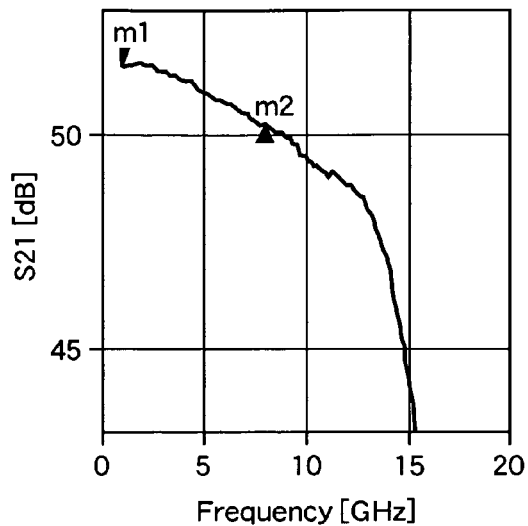
FIGS. 7A and 7B show frequency characteristics of the optical receiver module to explain effects.
Figure 7B:
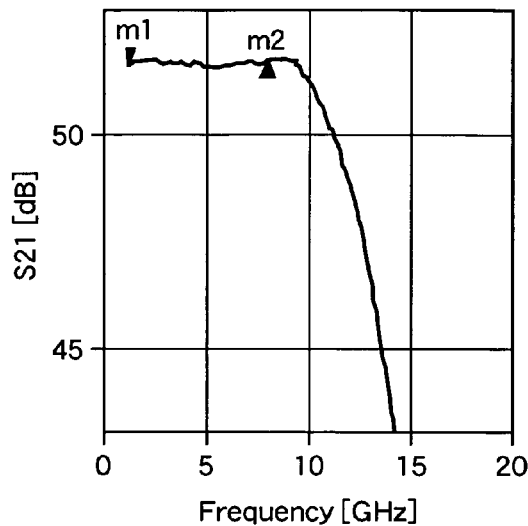

Example 1 will be described with reference to FIGS. 2 to 7A and 7B. Here, FIG. 2 is a plan view depicting main parts of an optical receiver module. FIGS. 3A and 3B are partially perspective plan views of a carrier substrate part. FIG. 4 is a perspective sectional view of the carrier substrate. FIG. 5 is a diagram of a high-frequency equivalent circuit from a photodiode to an input portion of a preamplifier. FIG. 6 is a graph showing a relation between input impedance and capacitance value. FIGS. 7A and 7B show frequency characteristics of the optical receiver module to explain effects.

First of all, a structure of an optical receiver module will be described by using FIG. 2. The optical receiver module uses a CAN-type package case as a case. A metal stem 1 is a mounting base for main parts of the CAN-type package case. The metal stem 1 is provided with columnar lead pins 10 to 14 via cylindrical through holes, and the pins are fixed by sealing glasses 20 to 24. A preamplifier IC chip 2 and a carrier substrate 3 are mounted on the metal stem 1. The metal stem 1 is used as a ground potential in the electrical sense. Metal electrodes 4 and 5 are provided on a surface of the carrier substrate 3. A semiconductor chip 6 is mounted on the carrier substrate 3 by flip-chip mounting that is face down mounting.

The semiconductor chip 6 is a back surface incidence-type photodiode chip, on a surface of which a semiconductor photodiode element and its anode and cathode electrodes are mounted. An optical modulation signal incident to the optical receiver module from an optical fiber enters the semiconductor chip 6 arranged near the center of the metal stem 1 from the upper vertical direction of the drawing though a coupling lens (not shown in the drawing). The semiconductor, photodiode element on the semiconductor chip 6 converts the received optical modulation signal into an electrical modulation signal by generating photocurrent. The electrical modulation signal output from the anode electrode of the semiconductor chip 6 is input to an input terminal of the preamplifier IC chip 2 through the metal electrode 5 and a bonding wire 7. The preamplifier IC chip 2 amplifies the weak electrical modulation signal, and outputs a differential signal, as an output signal, with a differential impedance of 100Ω to the output lead pins 10 and 11 through bonding wires 18 and 19. The cathode electrode of the semiconductor chip 6 is connected to a parallel flat plate capacitance 9 through the metal electrode 4 and a bonding wire 8, and is grounded to the metal stem 1 in the high frequency sense through the parallel flat plate capacitance 9. In the DC sense, the cathode electrode of the semiconductor chip 6 is further connected to, through a bonding wire 31, the lead pin 14 from which bias voltage for the semiconductor photodiode element is supplied.

A ground terminal electrode of the preamplifier IC chip 2 is connected to the metal stem 1 through a bonding wire 32, and a power terminal electrode is connected to the lead pin 12 via a parallel flat plate capacitance 17 that is a bypass condenser. The power source voltage of the preamplifier IC is +3.3V which is supplied from outside through the lead pin 12. A thermometry thermistor 15 of the preamplifier IC is connected to the lead pin 13 through a bonding wire 33. The parallel flat plate capacitance 16 is connected to an electrode of the preamplifier IC chip 2 through a bonding wire 34. The electrode of the preamplifier IC chip 2 is grounded in the high frequency sense through the parallel flat plate capacitance 16.

As the CAN-type package case, for example, a TO-CAN type case having 5.3 mmφ (phi) is used. As a material of the metal stem 1, inexpensive iron is preferably used for low cost. The carrier substrate 3 is composed of an aluminum nitride board 200 μm in thickness. As a material of the carrier substrate 3, another dielectric material such as alumina may be used. However, particularly in the case of using aluminum nitride for the carrier substrate 3, the difference of thermal expansion coefficients between the carrier substrate 3 and the semiconductor chip 6 for which an InP substrate is used can be minimized, which is preferable to prevent thermal changes of a receiver module characteristic. As the semiconductor photodiode element on the semiconductor chip 6, an avalanche photodiode or a PIN photodiode is used. Since high receiver sensitivity can be obtained in the avalanche photodiode, it is preferable to realize a receiver module for, particularly, long distance application.

Next, a structure of the carrier substrate part will be described with reference to FIGS. 3A, 3B and 4. The carrier substrate 3 in FIG. 3A is used when a preamplifier with a low input impedance of 20 to 30Ω is mounted. On the other hand, a carrier substrate 103 in FIG. 3B is used, in place of the carrier substrate 3, when a preamplifier with a high input impedance of about 70Ω is mounted.

On the carrier substrate 3, the metal electrodes 4 and 5 are provided with closely-facing portions which form a capacitance. A sectional structural diagram of the closely-facing portions of the carrier substrate 3 is shown in FIG. 4. Inside the carrier substrate 3, there is provided an inner electrode 25 that is a floating potential in the DC sense. A parallel flat plate capacitance between the metal electrode 4 and the inner electrode 25 is connected in a series connection manner to a parallel flat plate capacitance between the inner electrode 25 and the metal electrode 5 so as to form a capacitance between the metal electrodes 4 and 5. The capacitance value is set at 40 fF or more.

On the other hand, the closely-facing portions and the inner electrode are not provided between the metal electrodes 104 and 105 on the carrier substrate 103 so as to minimize the capacitance value between the both electrodes as low as possible. The semiconductor chip 6 is common with respect to the carrier substrate 3 and the carrier substrate 103, and the connected portion is provided at a common part in the carrier substrate 3 and the carrier substrate 103. The diode capacitance between the anode and cathode electrodes on the semiconductor chip 6 is set at 100 fF or less.

Next, the circuit configuration and operation will be described with reference to FIGS. 5 and 6. The high-frequency equivalent circuit from the photodiode to the input portion of the preamplifier is as shown in FIG. 5, where the capacitance value of the closely-facing portions on the carrier substrate 3 is represented as Cpad. In FIG. 5, Cpd, Rpd, L, and Rin represent a capacitance of the photodiode, a series resistance of the photodiode, an inductance configured by a bonding wire, and an input resistance of the preamplifier, respectively. A voltage Vin (ω) generated at both ends of the input resistance Rin is represented by Formula 2, where an angular frequency is represented as ω and photocurrent generated at the photodiode is represented as Iph (ω).

[Formula 2]

$$Vin(\omega)=Iph(\omega)*Rin/(1+j\omega(Cpd+Cpad)*(Rin+Rpd+j\omega L)-\omega^2*Cpad*Cpd*Rpd(Rin-1/(j\omega Cpd)+j\omega L)) \quad (2)$$

With the assumption that the capacitance Cpad and a frequency (ω/2π) are relatively small, Formula 3 can be obtained.

[Formula 3]

$$Vin(\omega)=Iph(\omega)*Rin/(1+j\omega)(Cpd+Cpad)*(Rin+Rpd+j\omega L)) \quad (3)$$

On the Basis of Formula 3, there will be examined a case in which the frequency characteristic of the optical receiver module is optimized by using, for example, the preamplifier with high linearity having an input impedance of 70Ω, and then the preamplifier is changed for the preamplifier with high receiver sensitivity having an input impedance of 30Ω.

As the input impedance is higher, a smaller capacitance value is demanded for the element capacitance in order to electrically secure the CR bandwidth. Further, in the case where an avalanche photodiode element is used, as the multiplication constant is larger, a bandwidth reduction occurs due to an increase in the frequency dependency of the multiplication constant, so that a much smaller capacitance value is demanded for the element capacitance in order to compensate for the bandwidth reduction. According to the study by the inventors, in the case of application to the optical receiver module with a bit rate of 10 Gbits/s by using the preamplifier with high linearity having an input impedance of 70Ω, it is necessary in terms of securing a bandwidth at up to a high frequency that the capacitance between the metal electrodes is minimized as low as possible by using the carrier substrate 103 and that a photodiode having a capacitance Cpd of 100 fF or less is used. It is preferable to obtain an optimum frequency characteristic under the conditions.

Here, the optical receiver modules with a bit rate of approximately 10 Gbits/s include, but not limited to, the SONET specification with bit rates of 9.95 Gbits/s, 10.7 Gbits/s, and 11.1 Gbits/s and the Ether specification with a bit rate of 11.3 Gbits/s.

Next, in order to further obtain the same good frequency characteristic as described above by changing the preamplifier for the preamplifier with high receiver sensitivity having an input impedance of 30Ω while using the same photodiode, it is understood by the above relation that L is changed in proportion to (Rin+Rpd) and (Cpd+Cpad) is changed in inverse proportion to (Rin+Rpd). Specifically, in the case where the series resistance Rpd of the photodiode is 60Ω, a good frequency characteristic can be realized by multiplying L by 0.69 ((30+60)/(70+60)) and by multiplying (Cpd+Cpad) by 1.44 ((70+60)/(30+60)). L is easily changed with a bonding wire length. On the other hand, (Cpd+Cpad) can be changed by increasing the capacitance value Cpad of the closely-facing portions on the carrier substrate part even with the use of the same light receiving element (capacitance Cpd is constant).

FIG. 6 is a graph showing a relation of the capacitance value (Cpd+Cpad) necessary for obtaining the same good frequency characteristic with respect to a change in the input impedance Rin of the preamplifier. In FIG. 6, the capacitance value (Cpd+Cpad) is normalized as 1 when Rin is 70Ω. According to the findings by the inventors, the series resistance Rpd of almost all of photodiodes used in optical modules has a range of 60Ω or less. According to the graph in FIG. 6, in order that the frequency characteristic of the optical receiver module is optimized by using the preamplifier having an input impedance of 70Ω and then the frequency characteristic of the optical receiver module is optimized by using the preamplifier having the same light receiving element and an input impedance of 30Ω or less, there has been obtained a result that the capacitance value (Cpd+Cpad) needs to be multiplied by 1.4 or more.

Next, the effects of Example 1 will be described with reference to FIGS. 7A and 7B. Both of FIGS. 7A and 7B are small signal gain (S21) characteristics of the optical receiver module using the preamplifier with high receiver sensitivity having an input impedance of 30Ω. On the semiconductor chip 6, there is mounted the avalanche photodiode element that is operated under the bias condition that the multiplication constant is 10. In the case where the preamplifier with high receiver sensitivity having a Cpd of 100 fF or less is mounted with the carrier substrate 3 and the capacitance value (Cpd+Cpad) is set at 100 fF, the characteristic shown in FIG. 7A is obtained. In the characteristic shown in FIG. 7A, the amount of in-band gain reduction is as large as −1.35 dB from 1 GHz to 8 GHz, and harmful effects are imposed on a power penalty at the time of, particularly, long distance transmission.

On the other hand, in the case where the preamplifier with high receiver sensitivity is mounted with the carrier substrate 103 and the capacitance value (Cpd+Cpad) is set at 140 fF, the characteristic shown in FIG. 7B is obtained. In the characteristic shown in FIG. 7B, an in-band gain change is improved to +0.15 dB from 1 GHz to 8 GHz, and it is effective in reduction of a power penalty at the time of long distance transmission.

According to Example 1, it is possible to obtain the optical receiver module that can realize a good frequency transmission characteristic (S21) even in the case where the preamplifiers having different input impedances are used while using the light receiving element with the same design.

In Example 1, the inner electrode 25 is provided and the capacitance between the metal electrodes 4 and 5 is configured by the capacitance in a parallel flat plate shape. However, the capacitance between the metal electrodes 4 and 5 may be configured by a capacitance in an interdigital shape in which teeth of two combs are alternately combined, without using the inner electrode. In this case, the carrier substrate 3 can be manufactured using a single-layer ceramic that costs less and it is preferable for reduction of manufacturing cost of the carrier substrate.

Example 2

Figure 8:
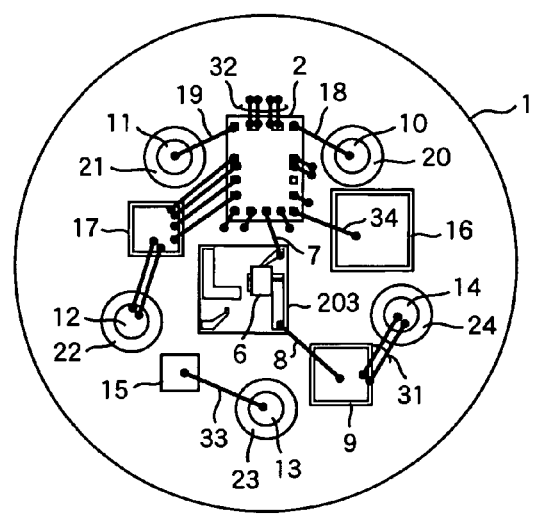
FIG. 8 is a plan view depicting main parts of an optical receiver module.
Figure 9A:
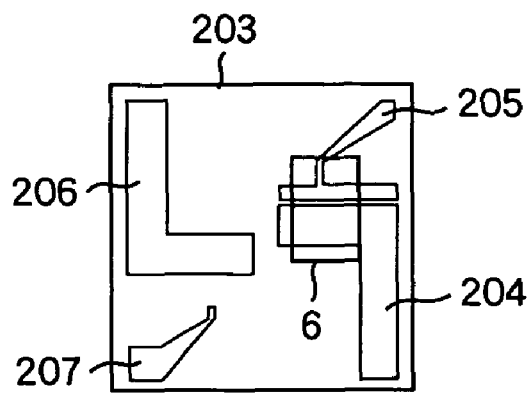
FIGS. 9A and 9B are partially perspective plan views of a carrier substrate part.
Figure 9B:
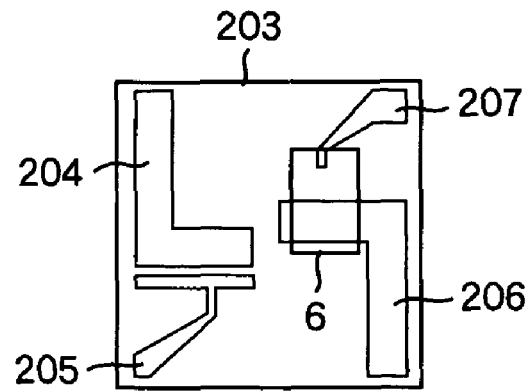

Example 2 of the present invention will be described with reference to FIGS. 8, 9A and 9B. FIG. 8 is a plan view depicting main parts of an optical receiver module. FIGS. 9A and 9B are partially perspective plan views of a carrier substrate part. FIG. 8 mainly differs from FIG. 2 of Example 1 in the point that plural patterns on which the semiconductor chip 6 is mounted are provided on a carrier substrate 203.

In FIGS. 9A and 9B, metal electrodes 204 and 205 as a first semiconductor chip mounting pattern and metal electrodes 206 and 207 as a second semiconductor chip mounting pattern are provided on the carrier substrate 203. The closely-facing portions and the inner electrode are provided between the metal electrodes 204 and 205 to form a capacitance whose value is set at 40 fF or more. On the other hand, the closely-facing portions and the inner electrode are not provided between the metal electrodes 206 and 207, and the capacitance value between the both electrodes is made as low as possible (less than 40 fF, or more preferably, less than 10 fF).

The frequency characteristic when using the preamplifier with high receiver sensitivity having an input impedance of 30Ω can be optimized by mounting the semiconductor chip 6 on the metal electrodes 204 and 205, as shown in FIG. 9A. Further, the frequency characteristic when using the preamplifier with high linearity having an input impedance of 70Ω can be optimized by rotating the direction of the carrier substrate 203 by 180 degrees and by mounting the semiconductor chip 6 on the metal electrodes 206 and 207, as shown in FIG. 9B. In these FIGS. 9A and 9B, the position of the semiconductor chip 6 relative to an outer shape of the carrier substrate 203 is to be the same, so that the optical receiver module can be manufactured without changing the arrangements of the respective parts shown in FIG. 8.

According to Example 2, it is possible to obtain a structure of the optical receiver module that can realize a good frequency transmission characteristic (S21) even in the case where the preamplifiers having different input impedances are used while using the light receiving element with the same design and the carrier substrate with the same design, which is further effective in reducing the manufacturing cost.

It should be noted that four metal electrodes are provided in Example 2, however, three metal electrodes may be provided by connecting the metal electrodes 206 and 204.

According to the present invention, it is possible to obtain the optical receiver module that can realize a good frequency transmission characteristic (S21) even in the case where the preamplifiers having different input impedances are used while using the light receiving element with the same design.

We claim:

1. An optical receiver module comprising:
   a semiconductor chip on which is formed a photodiode for converting an optical signal into an electrical signal;
   a carrier substrate for mounting said semiconductor chip;
   a preamplifier for amplifying said electrical signal; and
   a semiconductor mounting position having a pair of first electrodes formed on the carrier substrate,
   wherein said carrier substrate is composed of a dielectric material,
   wherein a capacitance between said pair of first electrodes of the carrier substrate is greater than or equal to 40 fF prior to mounting the semiconductor chip,
   wherein on said semiconductor chip is formed an anode electrode and a cathode electrode which are connected to the photodiode and the semiconductor chip is mounted on the semiconductor mounting position such that the anode electrode and cathode electrode are connected to the pair of first electrodes,
   wherein a capacitance between said anode electrode and said cathode electrode is less than or equal to 100 fF prior to mounting to the carrier substrate, and
   wherein said optical receiver is operated with a bit rate of approximately 10 Gbits/s.

2. An optical receiver module according to claim 1,
   wherein said carrier substrate is further formed a second semiconductor mounting position having a pair of second electrodes,
   a capacitance between said second electrodes is less than 40 fF prior to mounting the semiconductor chip.

3. The optical receiver module according to claim 2,
   wherein the capacitance between said second electrodes is less than 10 fF prior to mounting the semiconductor chip.

4. The optical receiver module according to claim 2,
   wherein an input impedance of said preamplifier is less than or equal to 30Ω.

5. The optical receiver module according to claim 2,
   wherein a power voltage of said preamplifier is less than or equal to 3.3V.

6. The optical receiver module according to claim 2,
   wherein said photodiode is formed on a front surface of the semiconductor chip,
   said semiconductor chip is a back surface illuminating type, and
   said semiconductor chip is mounted on said carrier substrate by face down mounting.

7. The optical receiver module according to claim 2,
   wherein said carrier substrate and said preamplifier are provided on a metal stem in a CAN-type case.

8. The optical receiver module according to claim 1,
   wherein an input impedance of said preamplifier is less than or equal to 30Ω.

9. The optical receiver module according to claim 1,
   wherein a power voltage of said preamplifier is less than or equal to 3.3V.

10. The optical receiver module according to claim 1,
    wherein said photodiode is formed on a front surface of the semiconductor chip,
    said semiconductor chip is a back surface illuminating type, and
    said semiconductor chip is mounted on said carrier substrate by face down mounting.

11. The optical receiver module according to claim 1,
    wherein said carrier substrate and said preamplifier are provided on a metal stem in a CAN-type case.

* * * * *